(12) United States Patent
Barbut et al.

(10) Patent No.: US 11,796,572 B2
(45) Date of Patent: Oct. 24, 2023

(54) CURRENT SENSING SYSTEM

(71) Applicant: Melexis Technologies SA, Bevaix (CH)

(72) Inventors: Lucian Barbut, Bevaix (CH); Simon Houis, Bevaix (CH); Lionel Tombez, Bevaix (CH); Tim Vangerven, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 22 days.

(21) Appl. No.: 17/515,075

(22) Filed: Oct. 29, 2021

(65) Prior Publication Data

US 2022/0137100 A1    May 5, 2022

(30) Foreign Application Priority Data

Oct. 31, 2020    (EP) .................................... 20205078

(51) Int. Cl.
  *G01R 15/20*    (2006.01)
  *H05K 1/02*    (2006.01)
  *H05K 1/18*    (2006.01)

(52) U.S. Cl.
  CPC ......... *G01R 15/202* (2013.01); *G01R 15/205* (2013.01); *H05K 1/0213* (2013.01); *H05K 1/181* (2013.01); *H05K 2201/10151* (2013.01)

(58) Field of Classification Search
  CPC .............. G01R 15/202; G01R 33/0047; G01R 33/0052; G01R 33/07; H05K 1/181; H05K 1/0213
  See application file for complete search history.

(56) References Cited

U.S. PATENT DOCUMENTS 5,481,203 A     1/1996  Appold
7,816,905 B2 *  10/2010 Doogue ............... G01R 15/207
                                          324/117 H (Continued)

FOREIGN PATENT DOCUMENTS

WO    2019038964 A1    2/2019

OTHER PUBLICATIONS

Extended Search Report from corresponding EP Application No. 20205078.7, dated Mar. 24, 2021.

(Continued)

*Primary Examiner* — Dominic E Hawkins
(74) *Attorney, Agent, or Firm* — WORKMAN NYDEGGER

(57) ABSTRACT

A current sensor system has a conductor and a packaged integrated circuit for sensing a current in the conductor. The conductor is external to the packaged integrated circuit. The packaged integrated circuit includes a substrate having an active surface and a back surface; one or more magnetic sensing elements; a processing circuit arranged to process signals received from the one or more magnetic sensing elements to derive an output signal indicative of a sensed current in the conductor; a housing; a plurality of leads; electrical connections between the leads and the active surface. The back surface of the substrate is disposed on a support formed by at least two inner lead portions of the plurality of leads and the active side of the substrate is oriented towards the outer ends of the outer lead portions of the leads in a direction perpendicular to a plane defined by the support.

17 Claims, 3 Drawing Sheets

(56) References Cited

U.S. PATENT DOCUMENTS

| | | | |
|---|---|---|---|
| 9,547,024 B2* | 1/2017 | Racz | G01R 33/07 |
| 9,958,482 B1* | 5/2018 | Latham | G01R 15/205 |
| 2004/0080056 A1* | 4/2004 | Lim | H01L 24/49 |
| | | | 257/784 |
| 2005/0245062 A1 | 11/2005 | Kingsbury et al. | |
| 2012/0146164 A1 | 6/2012 | Ausserlechner | |
| 2014/0111196 A1* | 4/2014 | Sakai | G01R 15/205 |
| | | | 324/252 |
| 2014/0333301 A1* | 11/2014 | Racz | G01R 15/20 |
| | | | 324/251 |
| 2016/0014916 A1* | 1/2016 | Ausserlechner | H05K 1/0203 |
| | | | 361/699 |
| 2018/0306842 A1* | 10/2018 | Fukunaka | G01R 15/202 |
| 2018/0321282 A1 | 11/2018 | Hurwitz | |
| 2019/0064225 A1 | 2/2019 | Parkhideh et al. | |
| 2019/0109233 A1 | 4/2019 | Tellkamp et al. | |
| 2019/0113545 A1* | 4/2019 | Dogiamis | G01R 15/20 |
| 2019/0386206 A1* | 12/2019 | Schaller | H01L 24/73 |
| 2020/0191834 A1 | 6/2020 | Bilbao De Mendizabal | |

OTHER PUBLICATIONS

Extended Search Report from corresponding European Application No. 21205443.1, dated Mar. 24, 2022.

\* cited by examiner

CURRENT SENSING SYSTEM

FIELD OF THE INVENTION

The present invention is generally related to the field of systems comprising a conductor and an integrated circuit for sensing a current in the conductor.

BACKGROUND OF THE INVENTION

Sensors are widely used in electronic devices to measure attributes of the environment and report a measured sensor value. Magnetic sensors more in particular are used to measure magnetic fields, for example in transportation systems such as automobiles. Magnetic sensors can incorporate Hall effect sensors that generate an output voltage proportional to an applied magnetic field associated with a current passing through a conductor or magneto-resistive materials whose electrical resistance changes in response to an external magnetic field.

Conventional current sensors based on Hall effect elements are well known in the art. The Hall effect is the production of a voltage difference (the Hall voltage) across an electrically conductive material (such as a wire), transverse to the electric current in the material and to an applied magnetic field perpendicular to the current. The voltage difference can be measured and, if the applied magnetic field is known, the current in the electrically conductive material can be deduced. Such a current sensor can be called a magnetic current sensor.

Magnetic current sensors that detect a magnetic field generated by a current are conventionally packaged in an integrated circuit (IC) housing. ICs are formed on a single die ('chip') cut from a semiconductor wafer containing a large number of identical dies. The dies are relatively small and fragile, are susceptible to harmful environmental elements, particularly moisture, and generate a relatively large amount of heat in a relatively small volume during operation. Accordingly, ICs must be packaged in an affordable, yet robust housing that protect them from the environment, enable them to be reliably mounted to and interconnected with, for example, a printed circuit board (PCB) populated with associated electronic components, and to effectively dissipate the heat they generate during operation.

FIG. 1 illustrates a cross-sectional view of a typical case. A die (12), e.g., a silicon die, contains a front side being an active side (13) and a back side (14). This back side is disposed on a die attach pad (15) (also called a paddle). On the active side is disposed an integrated circuit. Via fine conductive wire bonds (16) electrical interconnections are made between the integrated circuit and at least two leads (18) of a lead frame, e.g., a metallic lead frame. The leads extend from a first end integral with the frame to an opposite second end adjacent to, but spaced apart from, the die pad. The leads are arranged to carry signals outside of the package (10). In general, the die and inner portions of the lead frame are encapsulated with a moulding material to protect the electrical connections and the delicate electrical components on the active side of the die.

Another type of prior art solution is depicted in FIG. 2. In this so-called flip-chip arrangement the active side (13) of the die (12) is oriented in the opposite direction compared to FIG. 1. Solder balls (19) are used to establish connection between the inner portions of the leads and the substrate. The arrangement of FIG. 2 offers the advantage over that of FIG. 1 that the active side of the die is now closer to a conductor that may be provided below the packaged die.

There remains, however, a need for integrated circuits for current sensing wherein the distance between the active surface of the substrate and the package is kept as small as possible, so that a magnetic field created by a current flowing in an electrical conductor can be sensed by the integrated circuit as good as possible.

SUMMARY OF THE INVENTION

It is an object of embodiments of the present invention to provide for a system comprising an integrated circuit for current sensing having an active side so positioned that the sensitivity to sense a current in the conductor is improved.

The above objective is accomplished by the solution according to the present invention.

In a first aspect the invention relates to a current sensor system comprising a conductor and a packaged integrated circuit for sensing a current in the conductor. The conductor is external to the packaged integrated circuit. The packaged integrated circuit comprises:
  a substrate having an active surface and a back surface,
  one or more magnetic sensing elements disposed in or on the active surface of the substrate,
  a processing circuit disposed in or on the active surface of the substrate and arranged to process signals received from the one or more magnetic sensing elements to derive an output signal indicative of a sensed current in the conductor,
  a housing,
  a plurality of leads each having an outer lead portion extending outside the housing and an inner lead portion,
  electrical connections between the leads and the active surface of the substrate, wherein the back surface of the substrate is disposed on a support formed by at least two inner lead portions of the plurality of leads and the active side of the substrate is oriented towards the outer ends of the outer lead portions of the leads in a direction perpendicular to a plane defined by the support.

The proposed solution indeed allows for increasing the sensitivity when a current in the conductor is to be measured. This is achieved by having the active surface so positioned that it faces towards the outer lead portions. In some embodiments the increased sensitivity can be obtained by shortening the distance between the active surface and the conductor. In other embodiments an increase of sensitivity is achieved by using the inner lead portions as an electrostatic shield. In some embodiments the effects of shortening the distance and shielding are combined. Details are provided later in this description.

The at least two inner lead portions preferably do not overlap with the one or more magnetic sensing elements.

In one embodiment the one or more magnetic sensing elements are Hall effect plates disposed in the active surface of the substrate.

In one embodiment the one or more magnetic sensing elements are magnetoresistance elements.

In another embodiment the one or more magnetic sensing elements are compound semiconductors disposed on or stacked on the active surface of the substrate.

In embodiments of the invention two or more inner lead portions of the plurality of leads are bent. The bending can be in some embodiments with an offset in the direction away from the outer extremities of the outer lead portions. In other embodiments the bending is with an offset in the direction towards the outer extremities of the outer lead portions.

In advantageous embodiments the conductor is so positioned that the active surface of the substrate faces the conductor. In other advantageous embodiments the conductor is so positioned that the active surface of the substrate faces away from the conductor.

In some embodiments the outer ends of the outer lead portions are mounted on a printed circuit board or on a plastic support. In certain embodiments the printed circuit board comprises a ground layer.

In advantageous embodiments there is no magnetic material present in the integrated circuit to concentrate a magnetic field to be sensed by the one or more magnetic sensing elements. In other words, the integrated circuit of the system is then coreless.

In a more specific embodiment the conductor is a trace in a printed circuit board circuit.

In an embodiment the conductor is a bus bar.

In another aspect the invention relates to a current sensor system comprising a conductor and a packaged integrated circuit for sensing a current in said conductor, said conductor being external to the packaged integrated circuit, said packaged integrated circuit comprising a substrate having an active surface and a back surface,
one or more magnetic sensing elements disposed in or on the active surface of the substrate,
a processing circuit disposed in or on the active surface of the substrate and arranged to process signals received from the one or more magnetic sensing elements to derive an output signal indicative of a current sensed by the one or more magnetic sensing elements,
a housing,
a plurality of leads each having an outer lead portion extending outside the housing and an inner lead portion,
electrical connections between the leads and the active surface of the substrate, wherein the back surface of the substrate is disposed on a conductive support and the active side of the substrate is oriented towards the outer ends of the outer lead portions of the leads in a direction perpendicular to a plane defined by the support and wherein the conductor is so positioned that the active surface of the substrate faces away from the conductor.

The conductive support then shields the die from the conductor.

In one embodiment the support is a die paddle. The support may have at least one opening. In other embodiments the support does not have any opening.

Advantageously, the support is formed by at least two inner lead portions of the plurality of leads.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

In FIG. 8a the current conductor is below the current sensing circuit and in FIG. 8b the current conductor is integrated in the printed circuit board.

DETAILED DESCRIPTION OF ILLUSTRATIVE EMBODIMENTS

Figure 1:
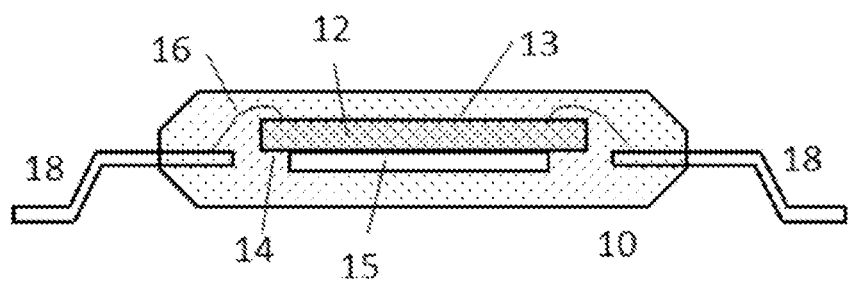
FIG. 1 illustrates a prior art solution.
Figure 2:
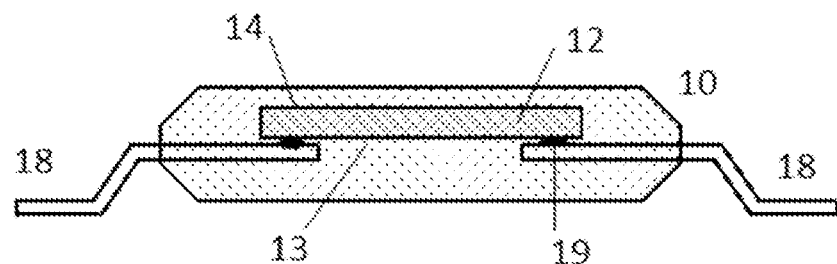
FIG. 2 illustrates another prior art scheme of a packaged integrated circuit.

The present invention will be described with respect to particular embodiments and with reference to certain drawings, but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

In one aspect the invention relates to a current sensing system comprising a conductor and a packaged integrated circuit as described in various embodiments hereafter. The integrated circuit is flip-chip arranged. In preferred embodiments the integrated circuit is positioned on top of the conductor that conducts electrical current. In other embodiments the conductor is on the other side with respect to the integrated circuit.

Figure 3:
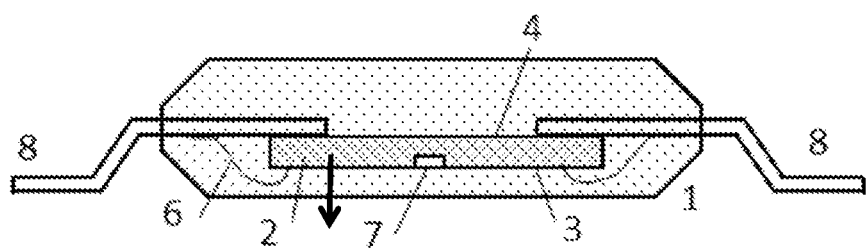
FIG. 3 illustrates an embodiment of the integrated circuit of the system according to the invention, wherein inner lead portions form the support.

FIG. 3 illustrates an embodiment of a packaged integrated circuit for current sensing comprised in a current sensor system according to this invention. The conductor itself is not shown in the figure. The circuit comprises a substrate (2) with an active surface (3) and a back surface (4). With active surface is meant the side that comprises the active circuitry. On or in the active side are disposed one or more magnetic sensing elements (7). The integrated circuit further comprises a processing circuit (not shown in the figure) disposed in or on the active surface, wherein signals-received from the one or more magnetic sensing elements are further processed to determine a signal indicative of the sensed current. Electrical connections (6), for example wire bonds, interconnect the substrate with leads (8) of a lead frame, via which signals can be brought outside the package. The leads typically comprise an inner lead portion inside the housing (1) and an outer lead portion extending outside the housing and having an outer end that is arranged to be placed on a printed circuit board or other wiring substrate. The electrical connections (6), e.g., the wire bonds, connect the lower surface of the inner lead portions with the active surface of the integrated circuit. The back surface of the substrate is disposed on the inner portions (or on at least part thereof) of the leads which serve as a support. This support forms a plane, for example in the embodiment of FIG. 3 a horizontal plane. The inner lead portions and the back side of the substrate are fixed to one another by means of for example a die attach adhesive or glue. It is not needed that all of the leads are used to form the support. In some embodiments only a subset of the leads serve as support, whereas other leads do not at all have any supporting function. The integrated circuit is arranged in a flipped configuration, whereby the active side is oriented in a direction away from the support (i.e., away from the inner portions of the lead) and towards the side where the outer lead portions are connectable to the printed circuit board. The arrow in FIG. 3 indicates this direction perpendicular to the support formed by the inner lead portions and towards the outer ends of the outer lead portions of the leads.

In embodiments of the invention the one or more magnetic sensing elements are silicon Hall effect sensors integrated in the active surface. In other embodiments TMR, GMR, or more generally magnetoresistance (MR) elements are used. In these embodiments the axis of sensitivity is parallel to the active surface. Additionally, or alternatively magnetic sensing elements may be stacked on top of the active surface, or assembled by transfer printing, as will be illustrated later in this description. In this case the semiconductor compounds can binary or ternary alloys.

Common elements for compound semiconductors comprise for example binary III-V materials like e.g., GaAs, InP, InSb, or ternary alloys, e.g., AlGaAs or InGaAs. In some embodiments the compound semiconductor material is a non-magnetic semiconductor material.

In some embodiments the one or more magnetic sensing elements is/are so positioned that there is no overlap with the leads of the lead frame.

In advantageous embodiments at least two magnetic sensing elements are provided in or on the active side of the substrate. Such a configuration with at least two magnetic sensing elements is advantageous, for example for performing offset cancellation and/or stray field rejection.

In preferred embodiments of the invention the one or more magnetic sensing elements are Hall effect elements. The magnetic sensing element then has an axis of sensitivity perpendicular to the active surface. In case at least two Hall effect elements are present, they are preferably orthogonally biased. As well known in the art, this means that the operation of the magnetic sensing elements is based on pairing an even number of sensing elements and biasing them orthogonally so that orthogonal current directions are obtained.

In embodiments the integrated circuit is disposed on, directly on, over, in contact with, for example in direct contact with, above, below or adjacent to a conductor surface of the system's conductor through which the current to be measured flows. In some embodiments the active surface of the substrate faces the conductor, as for example in FIG. 3. Given that the integrated circuit of the system according to these embodiments of the invention may be primarily designed to reduce the distance to the conductor, it is clear that embodiments wherein this objective is best met, are also most preferred.

In some embodiments the packaged integrated circuit of the system according to the invention is coreless, meaning that there is no magnetic core present, i.e., no magnetic material to concentrate the field. This is sometimes also referred to as a coreless sensor. Due to the flipped arrangement the sensitivity of the sensing circuit is increased so that there is no strict need for a magnetic core or concentrator. Further such a coreless sensor is also beneficial with respect to the linear behaviour, as non-linear effects due to the magnetic core or concentrator are avoided.

Some more embodiments of the system of the invention are now presented in detail.

Figure 4:
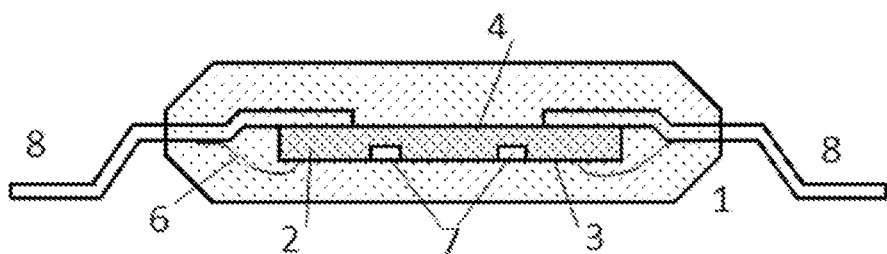
FIG. 4 illustrates an embodiment of the integrated circuit wherein the inner lead portions comprise an inner lead portion having a bent in a direction away from the outer ends of the leads.

In FIG. 4 an embodiment is shown wherein the inner portions of the leads display a small downset so that the parts containing the inner extremities of the leads (which serve as the support) form a horizontal plane slightly offset from the horizontal plane formed by the inner lead portions where they come out of the package. Note that, as in FIG. 3, the conductor is not shown. In FIG. 4 the offset is in the direction opposite to the location of the outer extremities of the outer lead portions, i.e., farther away from the outer ends of the outer lead portions. This offers the advantage that additional space is created between the active surface of the substrate (2) and the housing (1). The embodiment of FIG. 4 also shows a further optional sensing element. In a preferred embodiment these two magnetic sensing elements are orthogonally biased.

In a variant embodiment the small downset of the inner portions of the leads is in the opposite direction of the direction shown in FIG. 4. In other words, the parts containing the inner extremities of the leads form a horizontal plane slightly offset from the horizontal plane formed by the inner lead portions where they come out of the package, in the direction towards the lower surface of the housing. In this way the components of the active surface can be brought even closer to the conductor where the current is to be sensed.

Figure 5:
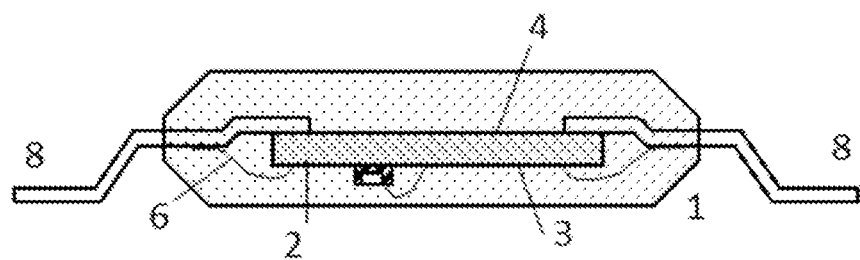
FIG. 5 illustrates an embodiment of the integrated circuit with a stacked magnetic sensor.

The extra space that may be gained is in the embodiment illustrated in FIG. 5 exploited to place a stacked magnetic sensor on the active surface (3). In other embodiments there may be more than one stacked magnetic sensor. Wire bonds 6 establish the connection between the active surface and the inner portions of the leads. The electrical connection between the stacked sensor and the substrate can be ascertained for example by means of wire bonding (as shown in FIG. 5) or via a redistribution layer. Alternatively, the stacked GaAs die can be flipped on the substrate and connected by means of solder balls to the substrate.

The stacked magnetic sensor(s) as in FIG. 5 may comprise at least one magnetic sensing element in a semiconductor compound material, e.g., an III-V semiconductor. Common elements for compound semiconductors comprise for example binary III-V materials like e.g., GaAs, InP, InSb, or ternary alloys, e.g., AlGaAs or InGaAs. If there is more than one magnetic sensing element, the various sensing elements may be made of the same semiconductor material or not. In some embodiments the compound semiconductor material is a non-magnetic semiconductor material.

Figure 6:
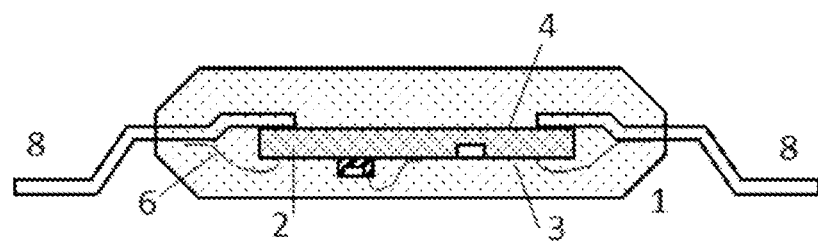
FIG. 6 illustrates an embodiment of the integrated circuit with both a stacked magnetic sensor and a sensing element in the die.

In FIG. 6 a combination is made of the embodiment of FIG. 5 with a stacked magnetic sensor and the embodiments of the preceding figures with a sensing element in the die.

The processing circuit disposed in the silicon substrate is not shown in any figure, but is now briefly described, even though this component is well known in the art. The processing circuit may comprise analog and/or digital electronics and is arranged to receive signals from the sensing elements. The processing circuit comprises computation means to derive an output signal indicative of the sensed signal, i.e., of the measured current in the conductor. In some embodiments information from a temperature sensor that may be part of the processing circuit can thereby be taken into account.

The conductor is in some embodiments so positioned that the active surface of the substrate faces the conductor. The conductor can have a plurality of conductor surfaces and can be a laminated structure with different electrically isolated layers of materials, for example electrically conductive materials. The sensing device can be disposed on, directly on, over, in contact with, for example in direct contact with or above a conductor surface of the conductor.

Figure 7:
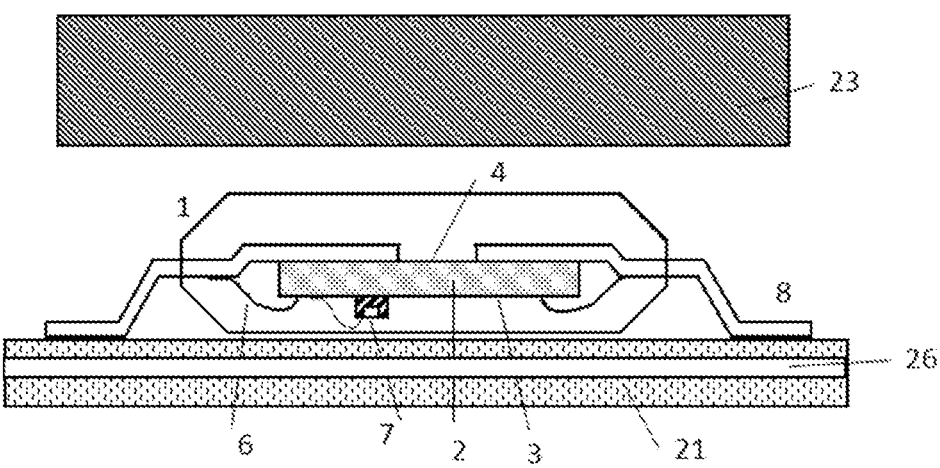
FIG. 7 illustrates an embodiment wherein the conductor is so positioned that the active surface of the substrate faces away from the conductor.

In the embodiment shown in FIG. 7 the active surface of the substrate faces away from the conductor. Hence, the conductor is now on the other side of the integrated circuit compared to the previously discussed embodiments. FIG. 7 illustrates an example wherein stacked magnetic sensors are applied. Similarly, as mentioned before, compound semiconductors comprising e.g., binary III-V materials can be used. Obviously, in other embodiments instead of stacked magnetic sensors, magnetic sensors in or on the active side of the substrate can be used. As the conductor is now located at the opposite side of the packaged integrated circuit, the inner lead portions do not only act as a support but also as an electrostatic shield for the capacitive coupling from the conductor to the integrated circuit. Advantageously, a ground layer (26) is provided, e.g., in the printed circuit board (21). Coupled with that ground layer the leads then can act as a Faraday cage. The set-up of FIG. 7 may be advantageous in that the printed circuit board is further away from the conductor and thus less subject to temperature increase. Another advantage may be an increased magnetic gain as there is no printed circuit board between the sensor and the conductor.

As set out above the integrated circuit is in some embodiments coreless, meaning that there is no magnetic material to concentrate the field. In such cases a coreless current sensor system is obtained.

The skilled person will readily appreciate that features described in relation to any of FIGS. 3 to 6, can readily be combined with the embodiment of FIG. 7.

Figure 8A:
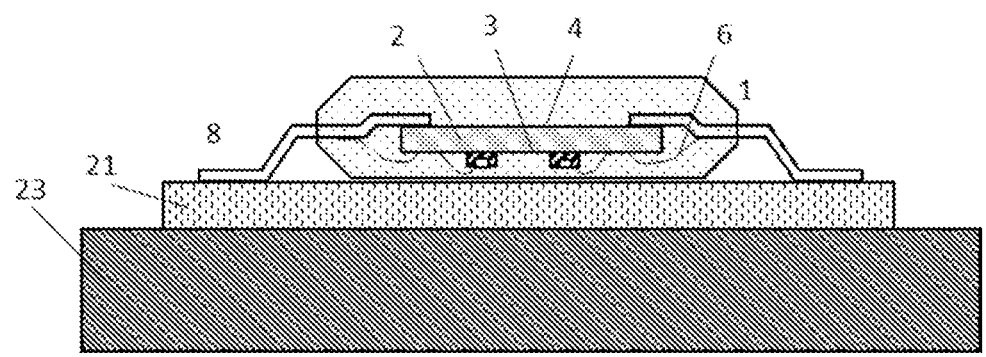
FIGS. 8a and 8b illustrate two embodiments of a current sensor system comprising a conductor and an integrated circuit according to the invention.

In the system of this invention the conductor is located outside the housing. In some embodiments the conductor is a bus bar. In some embodiments the outer ends of the outer lead portions can be mounted on a printed circuit board or on a plastic support. FIG. 8a provides an illustration. The bus bar (23) is in this example positioned below the printed circuit board (21) and faces the active surface of the integrated circuit. The distance between the conductor and the active surface of the integrated circuit is so made as short as possible. In the embodiment of FIG. 8a there are two stacked magnetic sensors provided on top of the die (2). Having two such stacked magnetic sensors is advantageous in that it allows deriving a differential signal, which is immune to stray fields. The processing circuit is then adapted to deal with differential signals.

In one embodiment the conductor has a cross section having a dimension (width and/or thickness) larger than the integrated circuit. The width and/or thickness may even be larger than the package, or larger than the sensor. An advantage is that high currents can be carried and measured. For example, the conductor can be larger than 110% the size of the chip, or larger than 150% the size of the chip. In one embodiment both the thickness and width are larger than 110% the size of the chip.

Figure 8B:
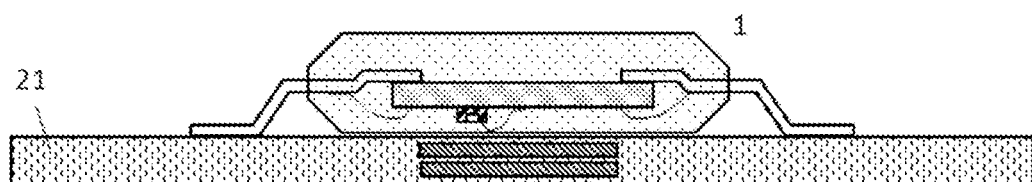

In some embodiments the conductor may be a trace in a printed circuit board circuit whereon the integrated circuit is assembled. This is depicted in FIG. 8b. The conductor in the printed circuit board may comprise one metal layer or two metal layers (as in FIG. 8b) or multiple metal layers. In some embodiments, the current conductor width and/or thickness is smaller in the vicinity of the current sensor, such as to locally increase the current density and increase the sensed magnetic field at the sensor location.

Figure 9:
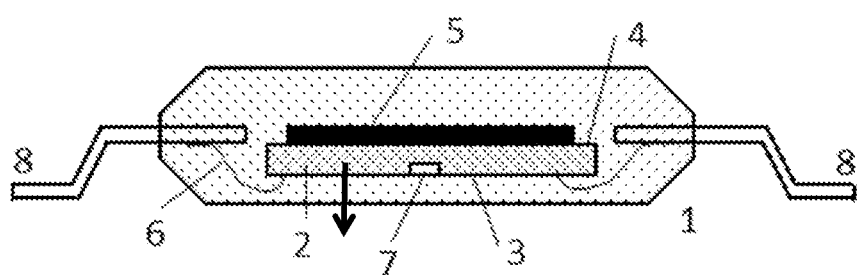
FIG. 9 illustrates a current sensing system comprising an integrated circuit with its back side on a supporting non-conductive die paddle.

In another aspect the invention also relates to an integrated circuit as depicted in FIG. 9 and to a system for current sensing comprising a conductor and such an integrated circuit. The integrated circuit comprises a substrate (2) with an active surface (3) and a back surface (4). With active surface is meant the side that comprises the active circuitry. On or in the active side are disposed one or more magnetic sensing elements (7). The integrated circuit further comprises a processing circuit (not shown in the figure) disposed in or on the active surface and similar to the one already discussed before, wherein signals received from the one or more magnetic sensing elements are further processed. Electrical connections (6), for example wire bonds, interconnect the substrate with leads (8) of a lead frame, via which signals can be brought outside the package. Techniques like heat staking may be optionally applied. The leads typically comprise an outer lead portion extending outside the housing (1) and arranged to be placed on a printed circuit board or other wiring substrate, and an inner lead portion inside the housing. The electrical connections (6), e.g., the wire bonds, connect the lower surface of the inner lead portions with the active surface of the integrated circuit. The back surface of the substrate is disposed on a support (5). The support is not necessarily aligned with the leads. In some embodiments the support is a non-conductive die paddle. This support forms a plane, for example in the embodiment of FIG. 9 a horizontal plane. The integrated circuit is arranged in a flipped configuration, whereby the active side is oriented in a direction away from the support (and from the inner portions of the lead) and towards the side where the outer lead portion are connectable to the printed circuit board. The arrow in FIG. 9 indicates this direction perpendicular to the support (5) and towards the outer lead portions of the leads.

As already discussed previously, the one or more magnetic sensing elements are silicon Hall effect sensors integrated in the active surface. In other implementations TMR, GMR, or more generally magnetoresistance (MR) elements are used. The axis of sensitivity is then parallel to the active surface. Additionally, or alternatively magnetic sensing elements may be stacked on top of the active surface, or assembled by transfer printing, as already mentioned earlier in this description. In this case the semiconductor compounds can binary or ternary alloys.

Also here common elements for compound semiconductors comprise for example binary III-V materials like e.g., GaAs, InP, InSb, or ternary alloys, e.g., AlGaAs or InGaAs. In some embodiments the compound semiconductor material is a non-magnetic semiconductor material.

The one or more magnetic sensing elements may be so positioned that there is no overlap with the leads of the lead frame.

Providing at least two magnetic sensing elements in or on the active side of the substrate may yield an advantageous configuration, for example for performing offset cancellation and/or stray field rejection.

The one or more magnetic sensing elements are preferably Hall effect elements. The magnetic sensing element then has an axis of sensitivity perpendicular to the active surface. In case at least two Hall effect elements are present, they are preferably orthogonally biased.

The integrated circuit in FIG. 9 is disposed on, directly on, over, in contact with, for example in direct contact with, above, below or adjacent to a conductor surface of the conductor through which the current to be measured flows. The active surface of the substrate faces the conductor in FIG. 9. As the integrated circuit may be primarily designed to reduce the distance to the conductor, it is clear that implementations wherein this objective is best met, are also most preferred.

Also here the packaged integrated circuit may be coreless. Due to the flipped arrangement the sensitivity of the sensing circuit is increased so that there is no strict need for a magnetic core or concentrator. Further such a coreless sensor is also beneficial with respect to the linear behaviour, as non-linear effects due to the magnetic core or concentrator are avoided.

Figure 10:
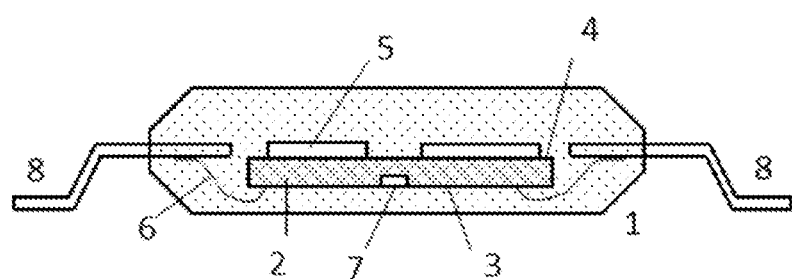
FIG. 10 a current sensing system comprising an integrated circuit with its back side supported on a conductive die paddle provided with an opening.

An alternative to FIG. 9 is presented in FIG. 10. The die paddle is made of conductive material. In that case the die paddle in the support is optionally provided with an opening. There may also be more than one opening. This is particularly advantageous in that the occurrence of eddy currents is reduced. The use of a conductive die paddle yields a cost-effective solution.

In a configuration as in FIG. 9 the conductor can be positioned as in FIG. 7, i.e., with the active surface of the substrate facing away from the conductor, provided that the die paddle is conductive. This also yields a shielding effect as in FIG. 7. Optionally, the die paddle may be connected to ground.

The configuration of FIG. 10 (i.e., with conductive die paddle with one or more openings and/or partial cut-out) can be used as in FIG. 7. The die paddle does not need to be continuous to act as an electrostatic shield. In particular, the one or more openings may be designed to be small enough such as to block electrostatic perturbation at or below a desired range of frequencies. Optionally, the magnetic sensing element can be disposed near the opening in the die paddle. In such a configuration, the integrated circuit is protected from electrostatic perturbation (capacitive coupling from the bus bar) and the sensing element is less affected by eddy currents flowing in the die paddle.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of

The invention claimed is:

1. A current sensor system comprising a conductor and a packaged integrated circuit for sensing a current in said conductor, said conductor being external to said packaged integrated circuit, said packaged integrated circuit comprising:
   a substrate having an active surface and a back surface,
   one or more magnetic sensing elements disposed in or on said active surface of said substrate,
   a processing circuit disposed in or on said active surface of said substrate and arranged to process signals received from said one or more magnetic sensing elements to derive an output signal indicative of a sensed current in said conductor,
   a housing,
   a plurality of leads having an outer lead portion extending outside said housing and an inner lead portion,
   electrical connections between each of said plurality of leads and said active surface of said substrate,
   wherein said back surface of said substrate is disposed on a support formed by at least two inner lead portions of said plurality of leads and said active side of said substrate is oriented towards the outer ends of said outer lead portions of said leads in a direction perpendicular to a plane defined by said support.

2. The current sensor system as in claim 1, wherein said at least two inner lead portions do not overlap with said one or more magnetic sensing elements.

3. The current sensor system as in claim 1, wherein said one or more magnetic sensing elements are Hall effect plates disposed in said active surface of said substrate.

4. The current sensor system as in claim 1, wherein said one or more magnetic sensing elements are magnetoresistance elements.

5. The current sensor system as in claim 1, wherein said one or more magnetic sensing elements are compound semiconductors disposed on or stacked on said active surface of said substrate.

6. The current sensor system as in claim 1, wherein two or more of said inner lead portions of said plurality of leads are bent.

7. The current sensor system as in claim 1, wherein said conductor is so positioned that said active surface of said substrate faces said conductor.

8. The current sensor system as in claim 1, wherein said conductor is so positioned that said active surface of said substrate faces away from said conductor.

9. The current sensor system as in claim 1, wherein said outer ends of said outer lead portions are mounted on a printed circuit board or on a plastic support.

10. The current sensor system as in claim 9, wherein said printed circuit board comprises a ground layer.

11. The current senor system as in claim 1, wherein said conductor is a trace in a printed circuit board circuit.

12. The current sensor system as in claim 1, wherein said conductor is a bus bar.

13. The current sensor system as in claim 1, being a coreless sensor system.

14. An integrated circuit for sensing a current, comprising:
   a substrate having an active surface and a back surface,
   one or more magnetic sensing elements disposed in or on the active surface of the substrate,
   a processing circuit disposed in or on the active surface of the substrate and arranged to process signals received from the one or more magnetic sensing elements to derive an output signal indicative of a current sensed by the one or more magnetic sensing elements,
   a housing,
   a plurality of leads each having an outer lead portion extending outside the housing and an inner lead portion,
   electrical connections between each of the plurality of leads and the active surface of the substrate,
   wherein the back surface of the substrate is disposed on a support formed by at least two inner lead portions of the plurality of leads and the active side of the substrate is oriented towards the outer ends of the outer lead portions of the leads in a direction perpendicular to a plane defined by the support.

15. The integrated circuit as in claim 14, wherein said support comprises a die paddle with at least one opening.

16. The integrated circuit as in claim 14, wherein said die paddle is made of non-conductive material.

17. An integrated circuit for sensing a current, comprising:
   a substrate having an active surface and a back surface,
   one or more magnetic sensing elements disposed in or on the active surface of the substrate,
   a processing circuit disposed in or on the active surface of the substrate and arranged to process signals received from the one or more magnetic sensing elements to derive an output signal indicative of a current sensed by the one or more magnetic sensing elements,
   a housing,
   a plurality of leads having an outer lead portion extending outside the housing and an inner lead portion,
   electrical connections between the plurality of leads and the active surface of the substrate,
   wherein the back surface of the substrate is disposed on a support formed by the inner lead portions of at least two discrete leads of the plurality of leads and the active side of the substrate is oriented towards the outer ends of the outer lead portions of the leads in a direction perpendicular to a plane defined by the support.

* * * * *